United States Patent
Álvarez López et al.

(10) Patent No.: US 11,415,615 B2
(45) Date of Patent: Aug. 16, 2022

(54) AIRBORNE SYSTEM AND METHOD FOR THE CHARACTERIZATION AND MEASUREMENT OF ANTENNAS OR RADIATING SYSTEMS

(71) Applicants: UNIVERSIDAD DE OVIEDO, Oviedo (ES); UNIVERSIDAD DE VIGO, Vigo (ES)

(72) Inventors: Yuri Álvarez López, Oviedo (ES); María Garcia Fernández, Oviedo (ES); Fernando Las-Heras Andrés, Oviedo (ES); Ana Arboleya Arboleya, Oviedo (ES); Borja González Valdés, Oviedo (ES); Yolanda Rodriguez Vaqueiro, Oviedo (ES); Antonio García Pino, Oviedo (ES)

(73) Assignees: UNIVERSIDAD DE OVIEDO, Oviedo (ES); UNIVERSIDAD DE VIGO, Vigo (ES)

( * ) Notice: Subject to any disclaimer, the term of this patent is extended or adjusted under 35 U.S.C. 154(b) by 345 days.

(21) Appl. No.: 16/490,714

(22) PCT Filed: Mar. 2, 2018

(86) PCT No.: PCT/ES2018/000015
§ 371 (c)(1),
(2) Date: Sep. 3, 2019

(87) PCT Pub. No.: WO2018/158472
PCT Pub. Date: Sep. 7, 2018

(65) Prior Publication Data
US 2020/0003817 A1    Jan. 2, 2020

(30) Foreign Application Priority Data
Mar. 3, 2017 (ES) .................................. 201700209

(51) Int. Cl.
*G01R 29/10* (2006.01)
*H04B 17/10* (2015.01)
(Continued)

(52) U.S. Cl.
CPC ............ *G01R 29/10* (2013.01); *B64C 39/024* (2013.01); *G08G 5/0095* (2013.01);
(Continued)

(58) Field of Classification Search
CPC .. G01R 29/10; H04B 17/102; H04B 7/18506; B64C 39/024; B64C 2201/027;
(Continued)

(56) References Cited

U.S. PATENT DOCUMENTS 10,067,172 B1 * 9/2018 Sternowski .......... G08G 5/0013
2015/0116164 A1   4/2015 Mannion et al.
(Continued)

OTHER PUBLICATIONS

A. Maheshwari, S. Behera, R. Thiyam, S. Maiti and A. Mukherjee, "Near field to far field transformation by asymptotic evaluation of aperture radiation field," 2014 International Conference on Signal Propagation and Computer Technology (ICSPCT 2014), 2014, pp. 745-749, doi: 10.1109/ICSPCT.2014.6884958. (Year: 2014).*
(Continued)

*Primary Examiner* — Aniss Chad
*Assistant Examiner* — Christine Nguyen Huynh
(74) *Attorney, Agent, or Firm* — Ladas & Perry LLP

(57) ABSTRACT

An airborne system and method for the characterization and measurement of radiating systems or antennas (5), including: an aerial module (1) including a unit for measuring electromagnetic emissions (11), which captures the electromagnetic field (E) radiated by the radiating system or antenna (5), and a positioning and guiding system (13) with an accuracy equal to or less than 3 cm; and a ground station (2) including a unit (23) for processing the electromagnetic
(Continued)

emission measurements, which processes the measurements using a set of algorithms for processing electromagnetic emission measurements (25). Also, a method for measuring and characterizing radiating systems or antennas (5). The invention is suitable for use in sectors that require antennas to be characterized and measured, such as, for example, radar and radio navigation facilities, terrestrial- and satellite-based telecommunications systems, or terrestrial broadcasting facilities.

24 Claims, 5 Drawing Sheets

(51) Int. Cl.
  B64C 39/02   (2006.01)
  G08G 5/00    (2006.01)
  H04B 7/185   (2006.01)
(52) U.S. Cl.
  CPC ...... *H04B 17/102* (2015.01); *B64C 2201/027* (2013.01); *B64C 2201/12* (2013.01); *B64C 2201/141* (2013.01); *B64C 2201/146* (2013.01); *H04B 7/18506* (2013.01)
(58) Field of Classification Search
  CPC .......... B64C 2201/12; B64C 2201/141; B64C 2201/146; G08G 5/0095
  See application file for complete search history.

(56) References Cited

U.S. PATENT DOCUMENTS

2016/0088498 A1* 3/2016 Sharawi ................. G01R 29/10
                                                    370/241
2018/0183529 A1* 6/2018 Coutts .................. H04B 17/102

OTHER PUBLICATIONS

A. Maheshwari, S. Behera, R. Thiyam, S. Maiti and A. Mukherjee, "Near field to far field transformation by asymptotic evaluation of aperture radiation field," 2014 International Conference on Signal Propagation and Computer Technology (ICSPCT 2014), 2014 (Year: 2014).*
ISR International Application No. PCT/ES2018/000015.
Written Opinion for International Application No. PCT/ES2018/000015.
Yuri Alvarez et al.: Antenna characterization using the Sources Reconstruction Method. Antennas and Propagation (Eu CAP), 2010 Proceedings of the Fourth European Confenrence on, Apr. 12, 2010 IEEE, Piscataway, NJ, USA. Dec. 4, 2010, pp. 1-5, XP031706035 ISSN ISBN 978-1-4244-6431-9; ISBN 1-4244-6431-5.
Giuseppe Virone, et al.: Antenna Pattern Verification System Based on a Micro Un-manned Aerial Vehicle (UA V), IEEE Antennas and Wireless Propagation Letters IEEE, Piscataway, NJ, US, Apr. 2, 2014, vol. 13, pp. 169-172, XP011539132 ISSN 1536-1225, <DOI: 10.1 109/LAWP.2014.2298250>.

* cited by examiner

AIRBORNE SYSTEM AND METHOD FOR THE CHARACTERIZATION AND MEASUREMENT OF ANTENNAS OR RADIATING SYSTEMS

RELATED APPLICATION

This application is an application under 35 U.S.C. 371 of International Application No. PCT/ES2018/000015 filed on 2 Mar. 2018 which claims priority from ES Application No. P201700209 filed on 3 Mar. 2017, the disclosures of which are incorporated in their entirety by reference herein.

TECHNICAL FIELD OF THE ART

The present invention relates to an airborne system for the characterization and measurement of antennas or radiating systems, comprising at least one aerial module, one ground-based station and a communication system between elements. The invention also relates to the method of processing the electromagnetic field radiated in order to obtain the distribution of the electromagnetic field at the aperture of the antenna or radiating system under measurement, from which it is possible to perform the diagnosis of the antenna under measurement, as well as its radiation pattern and the volume of electromagnetic protection.

The invention is applicable in sectors where the characterization and measurement of antennas or radiating systems is required, such as radar and radionavigation systems, terrestrial and satellite telecommunications systems, or terrestrial broadcasting installations.

STATE OF THE ART

The development of unmanned aerial vehicle technology such as drones, UAVs (Unmanned Aerial Vehicles), UASs (Unmanned Aerial Systems), RPAs (Remotely Piloted Aircraft), etc. is leading to their application in a wide range of sectors, such as cartography and topography, security and surveillance, infrastructure inspection, assistance in natural disasters, etc. One of their main advantages is the ability to access places that are difficult to access by land.

In the field of radiocommunications, the measurement and characterization of antennas or other radiating systems is one of the fundamental aspects for the verification of the correct functioning of a communications system, given that antennas are the element that acts as an interface between an unguided medium (air, vacuum) and a guided medium (coaxial cable, waveguide).

Systems for antenna measurement and characterization can be broadly classified into outdoor systems or ranges, and indoor systems or ranges. Outdoor systems or ranges enable the direct measurement of the antenna radiation pattern, since it is possible to separate the antenna under measurement from the antenna used as a measurement probe. The main drawbacks are the space needed for their implementation (mainly a considerable distance between the infrastructure where the antenna under measurement is located and the infrastructure where the antenna employed as a measuring probe is located), as well as exposure to inclement weather that limits its use.

With respect to indoor systems or ranges, they are typically located in enclosures called anechoic chambers, which are entirely covered with absorbent material that minimizes the reflection of electromagnetic waves by walls, floors and ceilings. As with outdoor ranges, the antenna under measurement is placed on a base or tower, and the antenna used as a measuring probe is placed on another base or tower at a certain distance from the first.

Depending on the size of the antenna under measurement, the working frequency and the distance between the antenna under measurement and the measuring probe, the electromagnetic field radiated by the antenna under measurement can be obtained in the near-field or far-field region of the antenna measured. It is typically considered that if the condition Rmeasure=2D2/λ and Rmeasure>10λ τσ μετ, the electromagnetic field is measured in the far-field region (where Rmeasure is the distance between the antenna measured and the measuring probe, D is the diameter of the minimum sphere circumscribed to the measured antenna, and λ is the working wavelength).

The measurement of the antenna radiation pattern can only be performed in the far field. If the antenna is measured in the near-field region, it is necessary to apply a near-field to far-field transformation algorithm to obtain the radiation pattern from the measurements made. This transformation algorithm is commonplace for the processing of measurements made in anechoic chambers, where due to their size it is not possible to directly measure the electromagnetic field radiated in the far-field region.

New communications systems have led to the development of more complex antennas in order to achieve certain radiation properties. Therefore, new techniques have also been developed that enable the characterization of the antenna, enabling the detection of possible faults therein. These techniques are of special interest in the case of antenna clusters (or arrays), where the failure of a single element corrupts the characteristics of the radiation pattern (e.g. worsening parameters such as directivity or ratio of secondary lobes). They are also applied in the detection of distortions in reflector-type antennas. Antenna diagnostic techniques make use of knowledge of the amplitude and of the phase of the electromagnetic field radiated (typically the near field) to obtain the distribution of the electromagnetic field in the aperture plane of the antenna to be diagnosed. From the representation of this field it is possible to identify distortions or elements with incorrect operation. So, in the document of Lopez, Y. A., Cappellin, C., Las-Heras, F., & Breinbjerg, O. (2008). On the comparison of the spherical wave expansion-to-plane wave expansion and the sources reconstruction method for antenna diagnostics. *Progress In Electromagnetics Research*, 87, 245-262, they compare two methods for the diagnosis of reflector-type antennas, one based on the characterization of the antenna under measurement by means of the expansion of the electromagnetic field radiated in a set of plane and spherical wave modes, and the other based on the characterization of the antenna under measurement by a distribution of reconstructed currents in the plane of aperture of the antenna. The document demonstrates that knowledge of the electromagnetic field in the plane of aperture enables the identification of the presence of distortions in the antenna under measurement. The main limitation of the methods presented is that they employ the measurement of the electromagnetic field on a canonical surface (a spherical surface in the case of the examples presented). In addition, in the case of the method based on the expansion of the radiated electromagnetic field into a set of plane and spherical wave modes, information on the size of the antenna under measurement is required in order to determine the number of modes necessary for the expansion of the electromagnetic field.

A disadvantage of the measurement and characterization of antennas in measurement ranges (indoor or outdoor) is the need to dismantle the antenna under measurement from its operational location, which entails a service outage. The rapid development of unmanned aerial vehicle technology has enabled the implementation of a new technique for measuring antennas by installing the measuring probe on an unmanned aerial vehicle.

This aerial vehicle follows a path around the antenna under measurement according to a predefined trajectory, in such a way that the measuring probe acquires the electromagnetic field radiated at the points of said trajectory.

The main advantages of antenna measurement systems using unmanned aerial vehicles are: i) it is not necessary to dismantle the antenna from its location, ii) it is not necessary to cause an interruption in the radiocommunication service, iii) its speed of measurement thanks to the flight speed of the unmanned aerial vehicle, iv) the ability to measure antennas located in places with difficult access, and v) the simplicity of the measurement system, as it does not require the entire infrastructure of an antenna measurement range. The main limitation is the accuracy of the results obtained, which will always be lower than that obtained in an antenna measurement range built for this purpose.

Interest in antenna measurement systems using airborne vehicles has led the International Telecommunication Union (ITU) to issue, in report ITU-R SM.2056-1, of June 2014, a series of general recommendations on measurement procedures, the necessary equipment and notification procedures for the radiation patterns of antennas measured from aircraft. This report makes additional recommendations for specific aircraft platforms and broadcasting systems, primarily for systems based on helicopters or manned aircraft.

The report is confined to the direct measurement of the antenna radiation pattern, thus indicating the need to carry out the measurement in the far-field region.

In the document by Virone, G., Paonessa, F., Peverini, O. A., Addamo, G., Orta, R., Tascone, R., & Bolli, P. (2014, November). Antenna pattern measurements with a flying far-field source (Hexacopter). In *Antenna Measurements & Applicatons (CAMA), 2014 IEEE Conference on* (pp. 1-2) and in the document by Virone, G., Lingua. A. M., Piras, M., Cina, A., Perini, F., Monari, J. & Tascone, R. (2014). Antenna pattern verification system based on a micro unmanned aerial vehicle (UAV). *IEEE Antennas and Wireless Propagation Letters,* 13, 169-172, a system is described based on an unmanned aerial vehicle of the hexacopter type, to which a wire antenna is attached, acting as a measuring probe. Positioning of the UAV is carried out by using waypoints and a Global Positioning System (GPS) that enables the UAV to follow a certain path around the antenna under measurement. The accuracy obtained in the flight path is approximately 5 m. In such systems, the UAV flies at a distance of tens of metres from the antenna being measured, so that the relative positioning error is low (<5% of the distance between the antenna being measured and the probe on board the UAV). This error is reduced to less than 1% thanks to the use of a laser-based tracking system or raster that enables the unmanned aerial vehicle to be located with centimetre precision from a ground-based station. In this way the electromagnetic field measurements can be georeferenced with said centimetre precision. The problem arising from the use of the laser-based tracking system is that it increases the complexity of the measurement system and requires a direct line of vision between the ground-based station where the laser is located and the UAV.

Another antenna measurement system using unmanned aerial vehicles is described in the document available from Drone Measures Tower Antenna Powers_SmartDrone, [retrieved 2017-01-03]. Retrieved from the Internet <http://www.smartdrone.com/drone-measures-tower-antenna-powers.html>, where unmanned aerial vehicle positioning is also carried out using waypoints and GPS positioning. In this case a positioning accuracy of +/−2 m is claimed.

Antenna measurement systems using the unmanned aerial vehicles described above capture only the amplitude of the electromagnetic field radiated by the antenna under measurement. Also, the measurement is made at a great distance from the antenna (tens or hundreds of metres), so as to ensure that it is in the far-field region of the antenna, minimizing the relative positioning error between the antenna under measurement and the measurement probe attached to the unmanned aerial vehicle. The main limitations of the techniques described are:

When measuring from tens or hundreds of meters from the antenna under measurement, dynamic range is lost, making necessary more sensitive power detectors (since the antenna under measurement is emitting with a certain power that cannot be adjusted).

The system provides only radiated electromagnetic field amplitude data that is not subsequently processed. Therefore, it is not possible to carry out the diagnosis of the antenna under measurement, which is a significant limitation, as in the case of antenna clusters or reflector-type antennas, it is not possible to reconstruct the electromagnetic field at the aperture of the antenna from the knowledge of the radiation pattern, nor consequently to identify elements with anomalous functioning or distortions in the reflector.

Therefore, existing systems and methods allow only the direct measurement of the radiation pattern, without the ability to carry out the diagnosis of the antenna under measurement. This limitation implies that, in addition, current systems do not enable the measurement of the amplitude and phase of the electromagnetic field radiated in the near-field region and the subsequent application of a near-field—far-field transformation to obtain the radiation pattern.

Patent document US 20160088498 A1 discloses a system for the characterization of the radiation emitted by an antenna, consisting of an unmanned aerial vehicle featuring an on-board signal strength detector antenna, and a method for characterizing the radiation of the antenna, based on georeferencing the measurements of the received signal level taken at a given position. The description of the invention indicates that the air vehicle positioning system can be based on a GPS system. Again, the main limitations are based on the fact that neither the system nor the method contemplates the recovery of the phase of the signal measured, which makes measurement impossible in the near-field region of the antenna under measurement, as well as the diagnosis of the antenna. Nor does the invention make any reference to imitations regarding working frequency bands.

Patent document U.S. Pat. No. 9,439,092 B1 discloses a system and method for carrying out the diagnosis of mobile telephone antennas. In this invention, heat maps are used to determine the elements or antennas that present an anomalous operation, given that the thermal image of the antennas is proportional to their emission power. The main disadvantage of this invention is that, in addition to being limited to a certain type of antennas, it does not enable the measurement of the radiation pattern.

The characterization of an antenna therefore entails the measurement of not only the amplitude of the electromagnetic field radiated, but also its phase. This requires measuring devices such as vector signal analysers or two-channel receivers (phase and square, I/Q): In-phase/

Quadrature). With regard to vector analysers, although portable commercial versions exist, their weight, price and complexity do not make their use feasible for the measurement and characterization of antennas by installing them on an unmanned aerial vehicle. With regard to two-channel receivers, their circuitry is simpler than that of vector analysers, resulting in more compact, cheaper and lighter-weight devices.

In the field of indoor range measurement of antennas (mainly in an anechoic chamber), methods have been developed to recover the phase of the electromagnetic field radiated by the antenna under measurement when the use of measuring devices capable of measuring amplitude and phase is not feasible. These methods can be classified into two main groups: on the one hand, interferometry-based methods, and on the other hand, iterative phase recovery methods.

In the document by Ana Arboleya, Jaime Laviada, Juha Ala-Laurinaho, Yuri Álvarez, Fernando Las-Heras, Antii V. Räisänen, "Phaseless Characterization of Broadband Antennas", IEEE Transactions on Antennas and Propagation, Vol. 64, No. 2, pp. 484-495, February 2016, a review of the state of the art of interferometry-based antenna measurement methods is presented, as well as a novel technique for measuring high-bandwidth antennas using only a power detector. The fundamental idea is to use the interference pattern created by two antennas. From the processing of the resulting signal by Fourier analysis, it is possible to recover the phase of the electromagnetic field radiated by the antenna under measurement. The main limitation of this type of methods with respect to their use for measuring antennas using unmanned aerial vehicles is the need for an additional antenna to generate the interference pattern, resulting in a more complex measurement configuration.

Iterative methods of phase recovery, as described in the document by Y. Alvarez, F. Las-Heras, and M. R. Pino. The sources reconstruction method for amplitude-only field measurements. *IEEE Transactions on Antennas and Propagation*, Vol. 58, No. 8, pp. 2776-2781, August 2010, are based on the minimization of a cost function or functional that relates the amplitude of the electromagnetic field measured on two or more surfaces located in the near-field region of the antenna under measurement to the amplitude of the electromagnetic field radiated by a distribution of equivalent sources located at the aperture of the antenna under measurement. When the value of said cost function or functional is zero, then said equivalent sources generate the same electromagnetic field as the antenna under measurement. Iterative phase recovery methods have the advantage that the measurement system is very simple (simply a power detector or electromagnetic field strength meter), but with the limitation that their use requires the use of two or more measurement surfaces.

The characterization of the antenna and calculation of the radiation pattern from the measurements of the electromagnetic field requires that the separation between two adjacent measuring points be equal to or less than half a wavelength at the measuring frequency when using a detector capable of measuring amplitude and phase, and equal to or less than a quarter of the wavelength at the measuring frequency when using a detector capable of measuring amplitude only. In the case of measuring antennas using unmanned aerial vehicles, the use of a positioning system based on real-time satellite kinematic navigation or RTK (Real Time Kinematik) provides positioning accuracy at a centimetre level, which limits the upper operating frequency in the S-band range (2 to 4 GHz).

Patent document ES 2577403 B2 discloses an airborne system and methods for the detection, location and obtaining of images of buried objects and the characterization of subsoil composition. In this invention the positioning and guidance system of the air module comprises a global positioning system, a positioning system based on inertial sensors, a positioning system based on real-time satellite kinematic navigation or RTK, and a positioning system based on photogrammetry. The positioning and guidance system enables the precise three-dimensional location of the aerial module and the georeferencing of the data obtained with the radar unit with an accuracy equal to or less than three centimetres. The invention requires a radar module that emits electromagnetic waves and, after being reflected by the ground, subsoil and/or possible buried objects, are received back into the radar module. Measurement of the delay time between the signal transmitted and that received yields the distance to the ground, subsoil and/or possible buried objects. The invention does not enable the measurement of antennas because the radar module is designed precisely to measure the reflection of the electromagnetic field emitted by the module itself, so it cannot measure the electromagnetic field emitted by another electromagnetic field source, such as an antenna. Likewise, radar signal processing algorithms enable the obtaining of an image of the subsoil and possible objects buried therein, but not the characterization of the radiation sources of an antenna nor the calculation of the radiation pattern. Another limitation of the invention is the fact that requiring two antennas, one for transmission and one for reception, entails greater technical complexity and requires an unmanned aerial vehicle with greater load capacity.

The solutions mentioned in the state of the art do not address the problem arising in the case where the working frequency of the antenna or radiating system under measurement overlaps partially or completely the frequency used by the means of communication between the UAV and the ground-based station; the examples presented always assume that these frequencies are sufficiently different not to interfere with each other. This assumption implies that the frequency of the means of communication is chosen on the basis of prior knowledge of the working frequency of the antenna under measurement.

However, the existence of antennas and multi-band radiation systems, as well as the restriction on the use of the radio-frequency spectrum to establish the frequency of the means of communication between the UAV and the ground-based station, limit this flexibility of choice of frequency of these means. In the event of said frequency overlap, the communication between the UAV and the ground station may suffer interference, leading to the partial or total loss of control of the air vehicle, diminishing or destroying its operational capability. This problem is exacerbated in the case of the measurement of antennas, as in the event of frequency overlap, the power emitted by the antenna under measurement is greater than the emission power of the transmitters used for communication between the air vehicle and the ground station.

EXPLANATION OF THE INVENTION

The present invention relates to an airborne system for the characterization and measurement of antennas or of electromagnetic wave radiating systems, comprising at least one aerial module, one ground-based station and a communication system between elements. The invention also relates to the method of processing the electromagnetic field radiated in order to obtain the distribution of the electromagnetic field at the aperture of the antenna or radiating system under measurement, from which it is possible to perform the diagnosis of the antenna under measurement, likewise to determine its radiation pattern and the volume of electromagnetic protection.

For the purposes of this invention and its description, "operator" refers to the person who is responsible for overseeing the different systems and methods that make up the invention, as well as interacting with the different processes that require human-machine communication.

For the purposes of this invention, a "measurement path" is understood to be the set of spatial coordinates defined by the operator prior to the use of the system and method described in the invention. The measurement of the electromagnetic field radiated by the antenna under measurement will be carried out in this set of spatial coordinates.

For the purposes of this invention, integral equations are understood to be the integral form of the Maxwell equations that relate electromagnetic field sources, either expressed as auxiliary coefficients or expressed as current distributions, to the electromagnetic field generated by those sources.

For the purposes of this invention, a theoretical field is understood to be that calculated from electromagnetic field sources using integral electromagnetic field equations.

One aspect of the present invention is an airborne system for the measurement and characterization of antennas or of electromagnetic wave radiating systems comprising:

At least one aerial module, which in turn comprises a receiving antenna that captures the electromagnetic field radiated by one or several antennas or radiating systems when the aerial module moves along the points of a measurement path, and an electromagnetic emission measurement unit connected to the receiving antenna. The air module further comprises an air module positioning and guidance system and an aerial control device that collects information from the electromagnetic emission measurement unit and from the positioning and guidance system, controls flight parameters of the air module and exchanges information with a ground-based station.

A ground-based station, which in turn includes an air module flight control system, a unit for processing the electromagnetic emission measurements received by the electromagnetic emission measurement unit, and a computer application. The electromagnetic emission measurement processing unit processes the measurements of the electromagnetic field radiated by the antenna or radiating system by means of a set of algorithms for the processing of electromagnetic emission measurements.

A means of communication to transmit and receive wireless signals between the aerial module and the ground-based station.

The receiving antenna of the system located in the aerial module is directed towards the antenna or radiating system, in order to capture the electromagnetic field radiated by one or more antennas or radiating systems.

On the other hand, the electromagnetic emission measurement unit directly or indirectly provides information on the amplitude and/or phase of the electromagnetic field radiated by the antenna or radiating system in the measurement path.

The positioning and guidance system of the air module comprises a global positioning system, a positioning system based on inertial sensors, a positioning system based on real-time satellite kinematic navigation or RTK, which exchanges information with a real-time satellite kinematic navigation base station located at the ground-based station, and a positioning system based on photogrammetry. The positioning and guidance system sends information to the aerial control device providing the precise three-dimensional location of the aerial module and the georeferencing of the electromagnetic field measurements radiated by the antenna or radiating system with an accuracy equal to or less than three centimetres. This is due to the fact that for the system algorithms to carry out correctly the processing of the measurements of the electromagnetic field radiated by the antenna under measurement, and for these to be characterized and measured, they require the precise three-dimensional location of the aerial module with a value equal to or less than three centimetres and the georeferencing of the data obtained with the electromagnetic emission measurement unit.

The amplitude and/or phase of the electromagnetic field radiated by the antenna or radiating system is processed by the electromagnetic emission measurement processing unit located at the ground-based station, thus characterizing the antenna or radiating system.

The diagnosis of the antenna under measurement, the calculation of the radiation pattern and the determination of the volume of electromagnetic protection are performed using the information that the aerial module exchanges with the ground-based station, where it is processed in the electromagnetic emission measurement processing unit, using a set of algorithms for the processing of electromagnetic emission measurements. A set of algorithms for the processing of electromagnetic emission measurements from the electromagnetic emission measurement processing unit is as follows: a near field—near field transformation algorithm for the obtaining of the distribution of the electromagnetic field at the aperture of the antenna, a near field—far field transformation algorithm for the obtaining of the antenna radiation pattern and an algorithm for determining the volume of electromagnetic protection of the antenna or radiating system.

The computer application, on the other hand, provides the radiation pattern, the radiation source diagram and/or the volume of electromagnetic protection of the antenna or radiating system, calculated by means of the set of algorithms for processing the measurement of electromagnetic emissions. In this way, the operator has at his disposal diagnostic information of the antenna or radiating system under measurement, in real time and in the same place where the antenna is located, resulting in savings in time and mobility.

The means of communication for transmitting and receiving wireless signals between the aerial module and the ground-based station use a frequency band selected from at least two different frequency bands, in order to avoid overlap with the frequency of the electromagnetic field radiated by the antenna or radiating system. This ensures that at least one of the two frequency bands employed will not overlap the frequency of the electromagnetic field radiated by the antenna or radiating system, ensuring proper communication between the aerial module and the ground-based station.

In a preferred embodiment, the system comprises two or more aerial modules.

In another preferred embodiment of the system, with one or more aerial modules, the aerial module is an unmanned aerial vehicle. In a more preferred embodiment, the unmanned aerial vehicle is of the multirotor type.

In another preferred embodiment of the system with one or more aerial modules, the trajectory may feature an arbitrary shape or geometry, provided that the distance from one measurement point to another is equal to or less than three centimetres.

In another preferred embodiment of the system with one or more aerial modules, the receiving antenna is coupled to a controlled articulated arm or controlled universal cardan joint suspension for it to be directed towards the antenna or radiating system.

In another preferred embodiment of the system with one or more aerial modules, the receiving antenna is attached to the aerial module, which is oriented to direct it towards the antenna or radiating system. One example for the realization of this embodiment is to incorporate a control software that flies the aerial module following the measurement path while maintaining the orientation of the receiving antenna toward the antenna or radiating device under measurement.

In another preferred embodiment of the system with one or more aerial modules, the unit for the measurement of electromagnetic emissions is a coherent detector that measures the amplitude and phase of the field radiated by the antenna or radiating system, measured in the measurement path.

In another preferred embodiment of the system with one or more aerial modules, the unit for the measurement of electromagnetic emissions is a power detector that measures the amplitude of the field radiated by the antenna or radiating system, measured in the measurement path. In a more preferred embodiment, the system further comprises an iterative phase-recovery algorithm that recovers the phase of the electromagnetic field radiated by the antenna or radiating system from the amplitude of the electromagnetic field radiated by the antenna or radiating system measured in the measurement path.

In an even more preferred embodiment, the iterative phase-recovery algorithm consists of calculating a set of auxiliary coefficients that characterize the antenna or radiating system by minimizing an FCa cost function defined by the following equation:

$$FCa = ||E|^2 - |\tilde{E}(Iq(Ca))|^2||^2$$

where $|E|$ represents the amplitude of the electromagnetic field radiated by the antenna or radiating system measured in the measurement path, $|\tilde{E}|$ represents the amplitude of the theoretical electromagnetic field calculated from the set of auxiliary coefficients, Iq denotes the integral equations of electromagnetic field that relate the theoretical electromagnetic field to the auxiliary coefficients and Ca represents the auxiliary coefficients.

When the FCa cost function has a value lower than a given tolerance, the amplitude of the theoretical electromagnetic field and the amplitude of the radiated electromagnetic field are considered to be sufficiently similar so that the set of auxiliary coefficients allows the radiated electromagnetic field to be modelled with an accuracy less than or equal to the given tolerance.

In an even more preferred embodiment, once the set of auxiliary coefficients has been calculated, the theoretical electromagnetic field in the measurement path is calculated, using the integral equations of electromagnetic field. The electromagnetic field radiated by the antenna or radiating system in the measurement path is calculated from the following expression:

$$E = |E| \exp(j<\tilde{E}>)$$

where $<\tilde{E}>$ is the phase of the theoretical electromagnetic field and $|E|$ is the amplitude of the electromagnetic field radiated by the antenna or radiating system.

In a specific embodiment of the system with one or more aerial modules, the flight control system of the aerial module or modules comprises a manual flight control system and a system for the generation of flight paths around the antenna under measurement, and automatic flight control. By means of the manual flight control system, an operator can supervise the performance of the exploration and can at any time take control to make corrections or prevent accidents.

Thus, the path to be followed by the aerial module for the measurement of the electromagnetic field radiated by the antenna under measurement can be entered by means of the path generation system and automatic flight control, for example by means of a file of georeferenced coordinates. Once entered, the operator of the invention will be able to instruct the system to start measuring the radiated electromagnetic field. The manual flight control system will enable the operator of the invention to take immediate control of the flight of the air module in the event of the risk of a collision, the presence of a strong wind altering the automatic trajectory or similar, landing it in a safe place.

In another specific embodiment of the system with one or more aerial modules, the means of communication comprise a bidirectional real-time communication system between the aerial module and the ground-based station. In a more specific embodiment, the communication system comprises one or more 3G/4G communication modules and/or one or more low-frequency transceivers and/or an IEEE 802.11 interface (Wi-Fi) and/or one or more Zigbee™ brand modules and/or one or more Bluetooth™ brand modules, or a combination of any of the above.

In another specific embodiment of the system with one or more aerial modules, the near field—near field transformation algorithm for the obtaining of the distribution of the electromagnetic field at the aperture of the antenna consists of the calculation of a distribution of currents that characterize the antenna or radiating system by minimizing an FCaf cost function that is given by the following equation:

$$FCaf = ||E - \tilde{E}(Iq(Meq))||^2$$

where E represents the electromagnetic field radiated by the antenna or radiating system measured in the measurement path, E represents the theoretical electromagnetic field calculated from the distribution of currents, Iq denotes the integral electromagnetic field equations that relate the theoretical electromagnetic field to the distribution of currents, and Meq represents the distribution of currents.

When the FCaf cost function has a value lower than a given tolerance, the theoretical electromagnetic field and the radiated electromagnetic field are considered to be sufficiently similar, so the current distribution enables the radiated electromagnetic field to be modelled with an accuracy of less than or equal to the given tolerance.

In a more specific embodiment, once the distribution of currents has been calculated, the theoretical electromagnetic field at any point in space is calculated using the integral electromagnetic field equations, and therefore the distribution of the theoretical electromagnetic field in the plane of aperture of the antenna or radiating system is also calculated. In an even more specific embodiment, the radiating source pattern provided by the computer application corresponds to the distribution of the theoretical electromagnetic field in the plane of aperture of the antenna or radiating system.

In another more specific embodiment of the system where the near field—near field transformation algorithm consists of the calculation of a current distribution by minimizing the FCaf cost function, or even more specific of the above system where, once the current distribution has been calculated, the theoretical electromagnetic field is calculated using the integral electromagnetic field equations, and therefore the distribution of the theoretical electromagnetic field in the plane of aperture, the near-field—far-field transformation algorithm for the obtaining of the radiation pattern of the antenna uses the current distribution characterizing the antenna or radiating system to calculate the theoretical electromagnetic field at any point in space using the integral electromagnetic field equations, and thus to calculate the theoretical electromagnetic field in the far-field region of the antenna or radiating system corresponding to the radiation pattern.

In another more specific embodiment of the system where the near field—near field transformation algorithm consists of the calculation of a current distribution by minimizing the FCaf cost function, or even more specific of the above system where, once the current distribution has been calculated, the theoretical electromagnetic field is calculated using the integral electromagnetic field equations, and therefore the distribution of the theoretical electromagnetic field in the plane of aperture, the algorithm for determining the volume of electromagnetic protection of the antenna or radiating system uses the distribution of currents characterizing the antenna or radiating system in order to obtain the levels of theoretical electromagnetic field in a cloud of points around the antenna or radiating system, subsequently to discriminate the points above the electromagnetic field reference level, thus obtaining the surface delimiting the volume of electromagnetic protection of the antenna or radiating system.

Another object of the present invention is a method for the measurement and characterization of antennas or radiating systems, comprising the following stages:
  a) Defining a measurement path around the antenna or radiating system to be measured and characterized.
  b) Directing the receiving antenna towards the antenna or radiating system.
  c) Obtaining the measurement of the electromagnetic field radiated by the antenna or radiating system by means of the electromagnetic emission measurement unit.
  d) Sending the measurement of the electromagnetic field radiated by the antenna or radiating system and the precise three-dimensional location of the aerial module to the ground-based station by using the communication system.
  e) Processing the measurement of the electromagnetic field radiated by the antenna or radiating system in the electromagnetic emission measurement processing unit to obtain the radiation pattern, the distribution of the electromagnetic field at the aperture, and the electromagnetic protection volume of the antenna or radiating system by means of a set of electromagnetic emission measurement processing algorithms comprising: a near field—near field transformation algorithm to obtain the distribution of the field at the antenna aperture, a near field—far field transformation algorithm to obtain the radiation pattern of the antenna and an algorithm to determine the electromagnetic protection volume of the antenna or radiating system.

In a preferred embodiment of the method, stages a) to d) are performed by two or more aerial modules that send the measurement of the electromagnetic field radiated by the antenna or radiant system and their precise three-dimensional location to the ground-based station using their communication system.

In another preferred embodiment of the method, in stage c) the electromagnetic emission measurement unit further processes the measurement of the electromagnetic field radiated by the antenna or radiating system obtained to convert it into a digital sequence. In stage (e), the electromagnetic emission measurement processing unit processes the measurement of the electromagnetic field radiated by the digitised antenna or radiating system. Thus, the measurement of the electromagnetic field radiated by the antenna or radiating system converted into a digital sequence is sent to the ground-based station where the electromagnetic emission measurement processing unit processes the measurement of the electromagnetic field radiated, digitalized by using the set of algorithms for processing electromagnetic emission measurements.

In another preferred embodiment of the method, or even more preferred of the method where, in addition to stages (a) to (d) being performed by two or more aerial modules, it further comprises varying the position of the aerial module along the measurement path and repeating stages (b), (c) and (d) prior to stage (e).

The invention provides a system and method for the on-site measurement and characterization of antennas and radiating systems, with no need to interrupt the operation of the communications system to which the antennas or radiating systems are connected.

The system of the invention enables the measurement of the amplitude and/or phase of the electromagnetic field radiated by the antenna or radiating system under measurement. The phase is measured either directly by using a coherent detector, or indirectly by using a power detector and applying an iterative phase recovery algorithm to the amplitude measurements.

The system, therefore, solves the limitation of traditional antenna measurement systems by using unmanned aerial vehicles where phase information is not available.

The measurements of the radiated electromagnetic field are obtained with a resolution equal to or less than three centimetres between two adjacent positions, which is more accurate than the systems known. This three-dimensional centimetre precision is achieved thanks to the fact that the system provides the precise three-dimensional location of the aerial module or modules and the georeferencing of the data obtained with the electromagnetic emission measurement unit.

Even considering a scenario in which the three-dimensional location margin of the aerial module or modules is three centimetres, the system can operate in a frequency band whose maximum frequency is 5 GHz (positioning accuracy of half a wavelength, which at 5 GHz is three centimetres) when a coherent detector is employed in the electromagnetic emission measurement unit, and 2.5 GHz (positioning accuracy of a quarter of a wavelength, which at 2.5 GHz is three centimetres) when a power detector is used in the electromagnetic emission measurement unit.

Thanks to its configuration, the aerial module or modules of the present invention are able to be positioned with a precision equal to or less than three centimetres which, at the working frequencies considered, and together with the capability of the system to provide information on the amplitude and/or phase of the field measured, enables the application of near field—near field transformation algorithms to obtain the electromagnetic field at the aperture of the antenna or radiating system under measurement, and to identify there-from possible distortions or elements with anomalous operation in the antenna under measurement. It also enables the application of near field—far field transformation algorithms to obtain the radiation pattern of the antenna under measurement, likewise the volume of electromagnetic protection, knowledge of which is required for the definition and delimitation of the safety perimeter around the antenna.

The iterative phase-recovery algorithm from the amplitude measurements, the near field-near field transformation algorithm and the near field—far field transformation algorithm enable working with trajectories with arbitrary geometry that do not have to adapt to a canonical surface or measurement volume (such as a flat, cylindrical or spherical measurement domain). This also solves one of the traditional limitations of this type of algorithm where, due to the formulation employed (for example, based on expansion in wave modes) the use of canonical surfaces or volumes was necessary.

One of the embodiments of the invention contemplates the use of a system formed by two or more aerial modules. This configuration enables the measurement of the antenna or radiating system under measurement in less time. The number of times the measurement time is reduced by using two or more aerial modules with regard to the measurement time using a single aerial module will be given by the number of aerial modules used.

In another embodiment of the invention, the means of communication for transmitting and receiving wireless signals between the aerial module and the ground-based station use a frequency band selected from at least two different frequency bands. In this way, unlike other alternatives, an overlap with the frequency of the electromagnetic field radiated by the antenna or radiating system can be avoided. This ensures that at least one of the two frequency bands used will not overlap the frequency of the electromagnetic field radiated by the antenna or radiating system, ensuring correct communication between the aerial module and the ground-based station under different circumstances of measurement.

The invention is applicable in sectors where antenna characterization and measurement are required, such as radar and radionavigation systems, terrestrial and satellite telecommunications systems, or terrestrial broadcasting installations.

Figure 1:
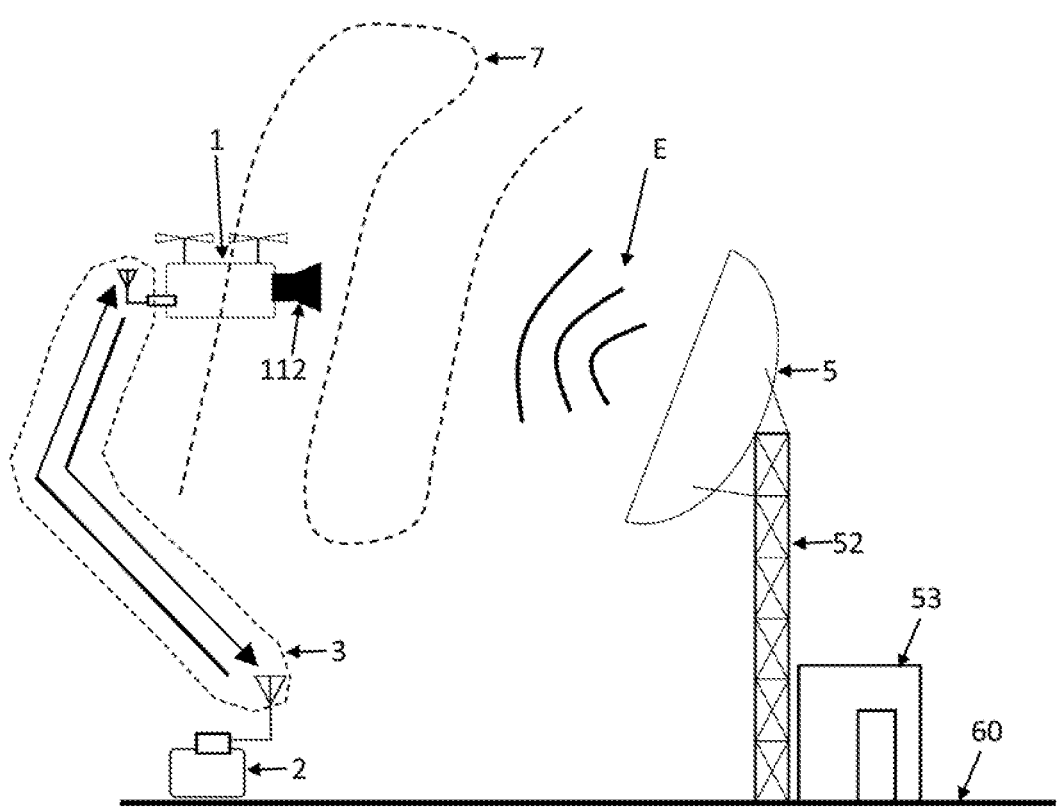
FIG. 1 portrays a general diagram of the system in which its component elements are identified, together with the antenna or radiating system (5) to be characterized. In this figure the antenna or radiating system (5) may be seen, deployed at a certain height above the ground (60) by means of a support structure (52). The figure also portrays the enclosure (53) destined to house the systems and devices for the generation of the electromagnetic field (E) radiated by the antenna or radiating system (5). A receiving antenna (112) may also be observed, capturing the electromagnetic field (E) radiated by the antenna or radiating system (5).

The receiving antenna (112) of the electromagnetic field (E) radiated is installed on an aerial module (1) that follows a measurement path (7) around the antenna or radiating system (5) and the supporting structure (52). In turn, the aerial module (1) communicates with a ground-based station (2) by means of a bidirectional real-time communication system (3) between the aerial module (1) and the ground-based station (2).

Figure 2:
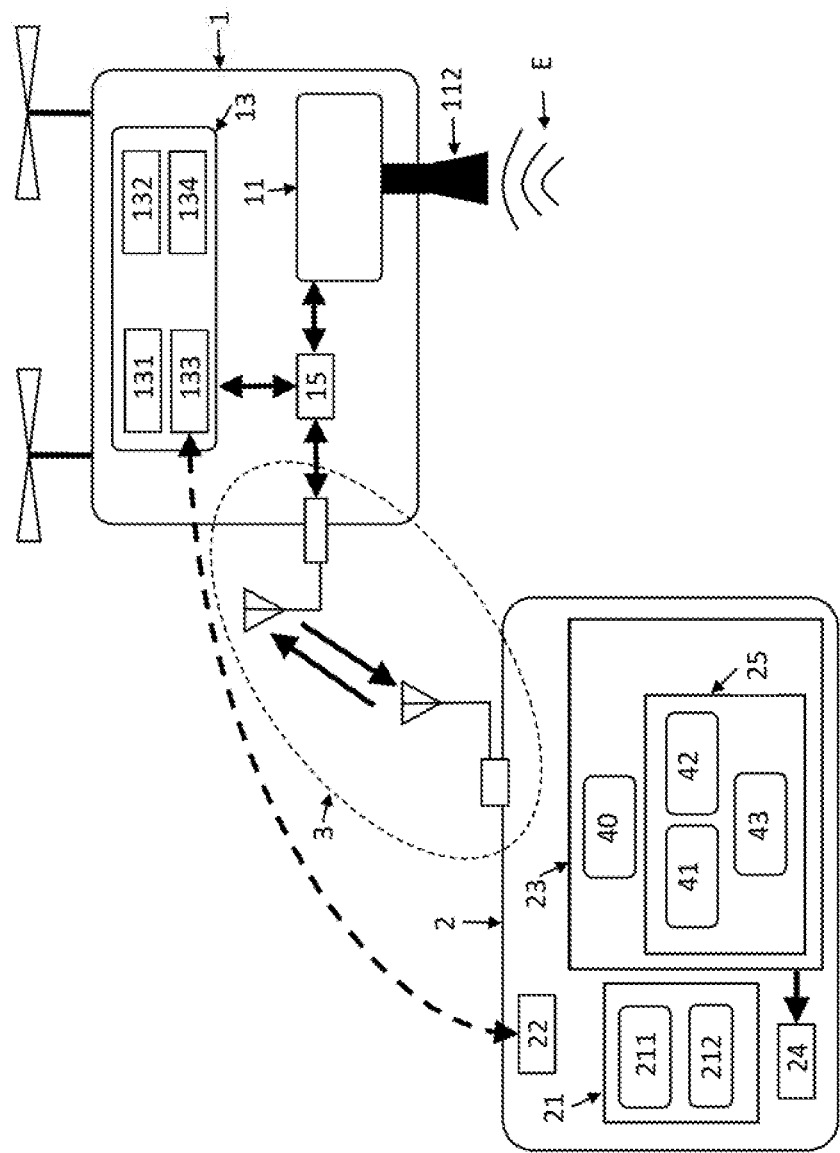

FIG. 2 portrays a general diagram of the system, identifying its component elements. In the figure, an aerial module (1) may be seen, formed by an electromagnetic emission measurement unit (11), the positioning and guidance system (13) of the aerial module (1) and an aerial control device (15). The figure also portrays a bidirectional real-time communication system (3) between the aerial module (1) and a ground-based station (2).

The aerial control device (15) is connected to the positioning and guidance system (13) of the aerial module (1), to the electromagnetic emission measuring unit (11), and to the real-time bidirectional communication system (3) between the aerial module (1) and a ground-based station (2).

The positioning and guidance system (13) comprises a global positioning system (131), a positioning kinematic navigation (133) that exchanges information with a real-time satellite kinematic navigation base station (22) located at the ground-based station (2), and a positioning system based on photogrammetry (134).

The electromagnetic emission measurement unit (11) comprises a receiving antenna (112) which captures the electromagnetic field (E) radiated by the antenna or radiating system (5).

The ground-based station (2) comprises a real-time satellite kinematic navigation base station (22), an aerial module flight control system (21), an electromagnetic emission measurement processing unit (23), a computer application (24) which provides the radiation pattern, the radiating source diagram (70) and/or the electromagnetic protection volume (61) of the antenna or radiating system (5) from information returned by the electromagnetic emission measurement processing unit (23), and a real-time bidirectional communication system (3) between the aerial module (1) and the ground-based station (2).

The aerial module flight control system (21) comprises a manual flight control system (211) and a system for the generation of flight paths and automatic flight control (212).

The electromagnetic emission measurement processing unit (23) comprises a set of electromagnetic emission measurement processing algorithms (25), with at least one near field—near field transformation algorithm, for the obtaining of the distribution of the field at the aperture of the antenna (41), a near field—far field transformation algorithm for the obtaining of the antenna radiation pattern (42), and an algorithm for determining the electromagnetic protection volume (61) of the antenna or radiating system (43).

Figure 3:
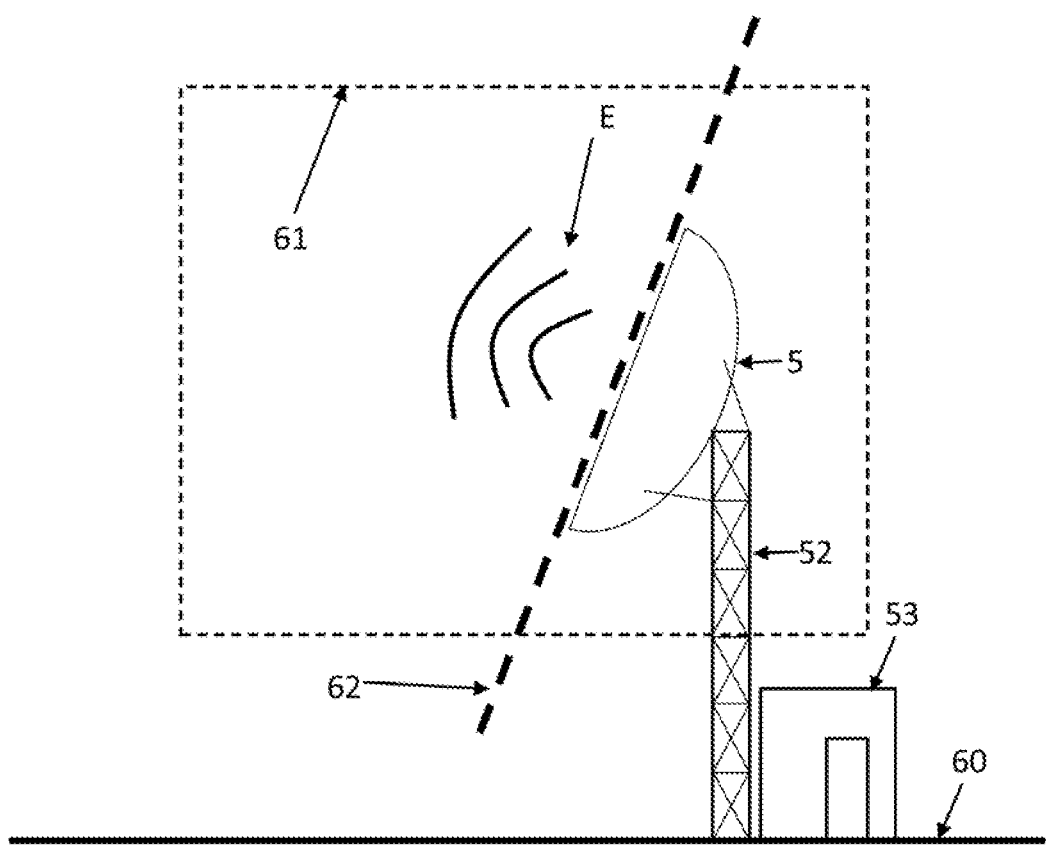

FIG. 3 represents a side view of the antenna or radiating system (5) to be characterized. In this figure the antenna or radiating system (5) may be seen, deployed at a certain height above the ground (60) by means of a support structure (52). The figure also portrays the enclosure (53) destined to house the systems and devices for the generation of the electromagnetic field (E) radiated by the antenna or radiating system (5). A section of the electromagnetic protection volume (61) of the antenna or radiating system (5) and the location of the aperture plane (62) of the antenna or radiating system (5) may also be observed.

Figure 4:
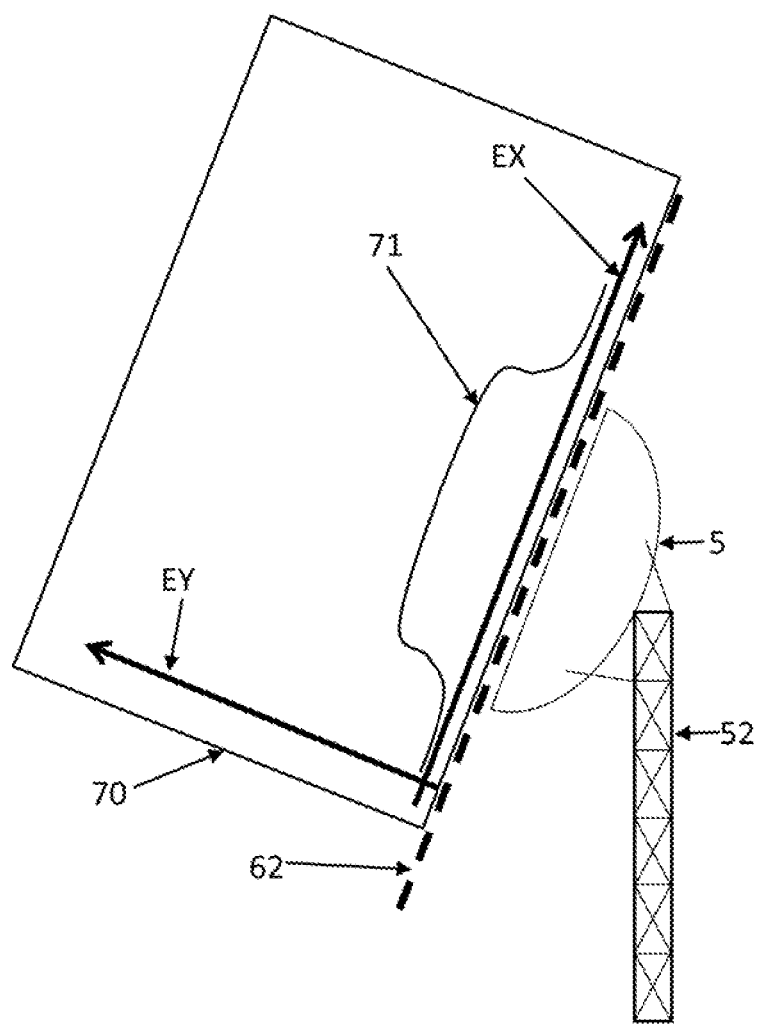

FIG. 4 portrays the radiation source diagram (70) of an antenna or radiating system (5) under measurement, framed in a rectangle disposed above the aperture plane (62) of the antenna or radiating system (5). The antenna or radiating system (5) is deployed on a support structure (52). The abscissa axis of the radiation source diagram (70), denoted by EX in the figure, is shown parallel to the plane of aperture (62). The amplitude of the distribution of the electromagnetic field in the plane of aperture (71) of the antenna or radiating system (5) may also be observed. The ordinate axis of the radiation source diagram (70), denoted by EY in the figure, represents the level of amplitude of the distribution of the electromagnetic field in the plane of aperture (71) of the antenna or radiating system (5), and is portrayed orthogonal to the plane of aperture (62). The antenna or radiating system (5) is a parabolic reflector-type antenna with no faults or distortions, so the amplitude of the distribution of the electromagnetic field in the plane of aperture (71) has a uniform value.

Figure 5:
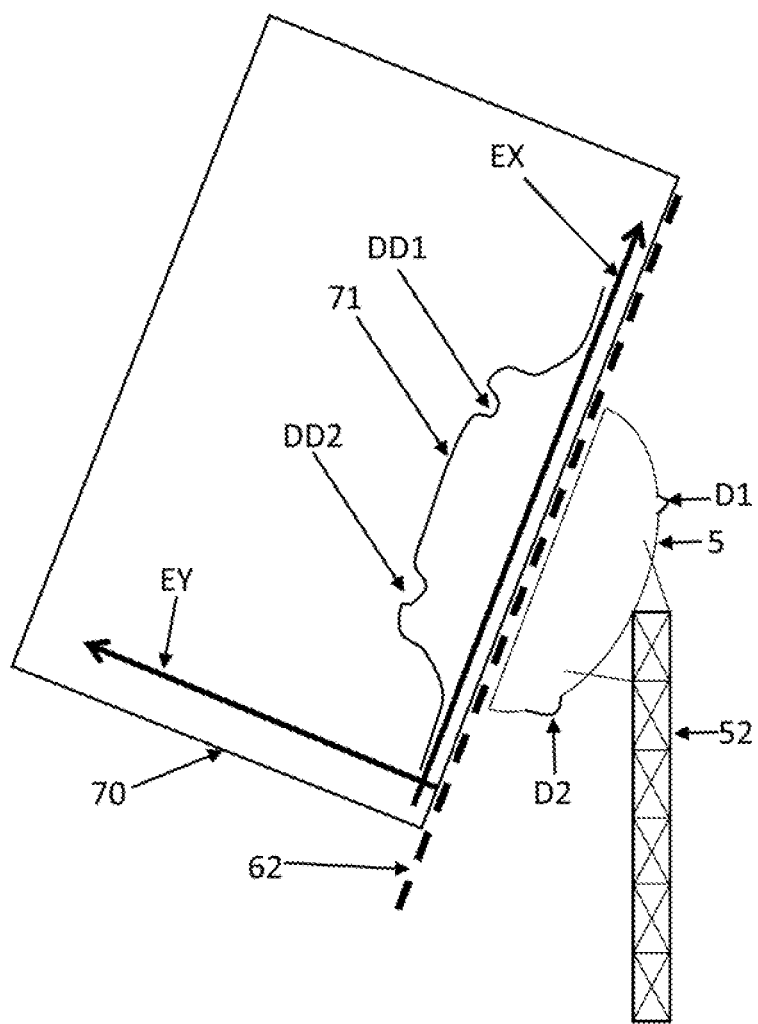

FIG. 5 portrays a radiation source diagram (70), similar to the previous figure, of an antenna or radiating system (5), consisting of a parabolic reflector-type antenna deployed on a support structure (52), but featuring faults or distortions, indicated in the figure by D1 and D2. Each distortion is displayed in the radiation source diagram (70) as an attenuation of the amplitude of the electromagnetic field distribution in the plane of aperture (71). These attenuations of amplitude are indicated as DD1 and DD2 in the figure.

EXPLANATION OF A PREFERRED EMBODIMENT

For the better understanding of the present invention, the following examples of preferred embodiments are disclosed, described in detail, and are understood to be without limitation of the scope of the invention.

Example 1

A first example of an embodiment of the invention was based on the use of a single aerial module (1) for the measurement and characterization of an antenna or radiating system (5) consisting of a mobile telephone base station antenna in the GSM-900 band (frequency band 890 MHz to 960 MHz) consisting of a cluster of eight patch-like elements disposed along a vertical axis perpendicular to the ground (60), resulting in a physical length of 1 m. The aerial module (1) employed was a multi-rotor type unmanned aerial vehicle, and more specifically, an octacopter with its corresponding aerial control device (15) and set of batteries. The aerial control device (15) was implemented by means of a Raspberry Pi™ brand microcontroller and was programmed to collect information from the electromagnetic emission measurement unit (11) and the positioning and guidance system (13), to control flight parameters of the aerial module (1) and to exchange information with a ground-based station (2).

The octacopter used, together with the aerial control device (15) and the batteries, had a maximum take-off weight of 6 kg, with a payload capacity of 1.5 kg. Said payload capacity was used to install and integrate the following elements into the octacopter:

An IEEE 802.11 (Wi-Fi) interface belonging to the bidirectional real-time communication system (3) between the air module (1) and the ground-based station (2). This interface was connected to the aerial control device (15).

A positioning and guidance system (13) of the aerial module (1). This system consisted of four subsystems, described below. (i) a positioning system based on inertial sensors (132) which were included in the aerial control device (15) of the octacopter; (ii) a global positioning system (131): the GPS receiver included in the aerial control device (15) of the octacopter was used; (iii) a positioning system based on real-time satellite kinematic navigation (133) to exchange information with a real-time satellite kinematic navigation base station (22) located in the ground-based station (2): two RTK units were acquired, one of which was located in the ground-based station (2) and the other in the aerial module (1). These RTK units used a Wi-Fi radio link to send the GPS coordinate correction information to the receiver of the RTK base station to the GPS unit with RTK functionality installed in the aerial module (1). Therefore, the information provided by the RTK unit and the information provided by the GPS were combined to obtain the georeferenced coordinates of the aerial module (1); (iv) a positioning system based on photogrammetry (134): this was implemented by installing a webcam on the octacopter which sent photographs every time a measurement was launched from the electromagnetic emission measurement unit (11). By means of the digital processing of two or more photographs taken at different time intervals, it was possible to determine the movement of the octacopter from one position to another.

The spatial information provided by the positioning and guidance system (13) was processed using a data fusion technique implemented in a Raspberry Pi™ brand microcontroller that returned a single set of georeferenced spatial coordinates from the aerial module (1).

With regard to the electromagnetic emission measurement unit (11), a power detector was used in the 100 MHz to 3 GHz band providing an output voltage proportional to the amplitude of the electromagnetic field (E) radiated by the mobile telephone base station antenna to be characterized. A monopole-type antenna with a working frequency of 900 MHz and a bandwidth of 10 MHz was used as the receiving antenna (112) connected to the electromagnetic emission measurement unit (11). Thus, the receiving antenna (112) established the working frequency for this particular example, avoiding the use of frequency selective filters. The selected frequency and bandwidth enabled the measurement of part of the working band of the mobile telephone base station antenna (890 MHz to 960 MHz).

The octacopter featured an articulated arm on which a receiving antenna (112) was mounted in order to partially compensate for the oscilations produced during flight.

The ground-based station (2) and its component elements were as follows and were implemented and integrated as follows:

The flight control system (21) of the serial module (1). For the manual flight control system (211), use was made of the remote control that came as standard with the octacopter, which was fitted with a transmitter that used the 2.4 GHz to 2.5 GHz frequency band. With regard to the system for path generation and automatic flight control (212), a computer application was developed to enable the user to specify the coordinates of the path to be followed by the aerial module (1) to measure the electromagnetic field (E) radiated by the antenna for a mobile telephone base station. The system was configured to operate using the coordinates provided by the path generation and automatic flight control system (212), giving priority to the manual flight control system (211) in order to regain control over the aerial module (1) if necessary.

The electromagnetic emission measurement processing unit (23). This was implemented on a laptop computer, which executed the electromagnetic emission measurement processing algorithms (25). These algorithms were programmed using a high-level programming language.

The computer application (24), providing the radiation pattern, the radiation source diagram (70) and the electromagnetic protection volume (61) of the antenna or radiating system (5). A graphic computer application (5) was developed to enable the system operator to view the emission intensity of the radiating elements of the antenna for a mobile telephone base station, as well as to view the radiation pattern of the antenna or radiating system (5) in a three-dimensional graph in spherical coordinates.

The real-time satellite kinematic navigation base station (22): this consisted of one of the two aforementioned RTK units. The other RTK unit was installed on the aerial module (1).

An IEEE 802.11 (Wi-Fi) interface belonging to the bidirectional real-time communication system (3) between the aerial module (1) and the ground-based station (2). This interface was connected to the laptop computer that implemented the electromagnetic emission measurement processing unit (23) and the path generation and automatic flight control system (212), and also to the control implementing the manual flight control system of the aerial module (211).

In this embodiment, the real-time bi-directional communication system (3) used the 2.4 GHz to 2.5 GHz band, so there was no overlap with the working frequency band of the mobile telephone base station antenna (890 MHz to 960 MHz).

The mobile telephone base station antenna was deployed on a support structure (52) at a height of 8 m above the ground (60). A measurement path (7) of zigzag flight in a vertical plane measuring 6 m×6 m was therefore defined, located 5 m in front of the plane of aperture (62) of the mobile telephone base station antenna and centred with regard to the antenna. As the wavelength at the measurement frequency was 33 cm, the electromagnetic field (E) radiated was measured every 8 cm, resulting in a total of 5625 measurement points.

The aerial module (1) moved at a speed of 50 cm/s, so that the complete travel of the zigzag measurement path (7), 456 m, was completed in 15 minutes. Throughout the measurement path (7), the receiving antenna (112) was directed towards the mobile telephone base station antenna by means of the articulated arm. The batteries supplying power to the octacopter enabled a range of 18 minutes, providing a safe time margin for the operator of the aerial module (1) to carry out take-off and landing manoeuvres.

Since the measurements of the electromagnetic field (E) radiated were made with a power detector, no direct phase measurements were available. Therefore, the iterative phase-recovery algorithm (40) was applied to the amplitude measurements of the electromagnetic field (E) radiated, measured in the measurement path (7). The iterative phase-recovery algorithm (40) minimized the cost function FCa. After 53 iterations, a tolerance or difference equal to or less than 2% was obtained between the amplitude of the theoretical electromagnetic field calculated from a set of auxiliary coefficients and the amplitude of the electromagnetic field (E) radiated.

Measured amplitude and recovered phase data from the electromagnetic field (E) radiated, georeferenced with an accuracy equal to or less than 3 cm, were entered into the electromagnetic emission measurement processing unit (23) to perform the characterization and diagnosis of the mobile telephone base station antenna. First, the near-field—near-field transformation algorithm was executed to obtain the distribution of the electromagnetic field at the antenna aperture (41), which minimized an FCaf cost function relating the electromagnetic field (E) radiated by the mobile phone base station antenna with the theoretical electromagnetic field calculated from a current distribution. After 17 iterations of the near field—near field transformation algorithm in order to obtain the distribution of the electromagnetic field at the aperture of the antenna (41), a tolerance or difference between the electromagnetic field (E) radiated and the theoretical electromagnetic field of less than or equal to 1% was obtained.

The current distribution was used to calculate the theoretical electromagnetic field in the plane of aperture (71) of the mobile telephone base station antenna. The information on the theoretical electromagnetic field in the plane of aperture was entered into the computer application (24) to represent the radiation source diagram (70) of the mobile telephone base station antenna. It was observed that the 8 elements making up the mobile telephone base station antenna had an amplitude variation of less than 1 dB; it was therefore concluded that the 8 elements of the antenna were operating correctly according to the manufacturer's specifications.

The current distribution calculated with the near field—near field transformation algorithm for the obtaining of the electromagnetic field distribution at the aperture of the antenna (41) was also used in the near field—far field transformation algorithm for the obtaining of the antenna radiation pattern (42). The radiation pattern of the mobile telephone base station antenna was represented in the computer application (24), noting that said pattern also met the specifications provided by the manufacturer for this type of antenna in terms of secondary lobe levels and tilt of the main lobe.

Finally, the algorithm for the determination of the electromagnetic protection volume (43) of the antenna or radiating system was executed, using current distribution to calculate the electromagnetic protection volume (61) of the mobile telephone base station antenna. The volume of protection obtained was a parallelepiped measuring 7 m long×4 m wide×3 m high. These dimensions were found to be in line with those of the usual safety enclosures for this type of mobile telephone antenna.

The execution time of the algorithms for processing electromagnetic emission measurements (25) was less than 2 minutes, which enabled the diagnosis and characterization of the mobile telephone base station antenna at the same location where the measurement was made with the system and method described.

Example 2

For this embodiment, the system described in example 1 was employed, but using a coherent detector in the 100 MHz to 3 GHz band with two output channels corresponding to the real and imaginary part of the complex signal measured, which in this case was the electromagnetic field (E) radiated by a mobile telephone base station antenna. Each output channel provided a voltage proportional to the real and imaginary part of the electromagnetic field (E) radiated.

Since the coherent detector employed weighed more than the power detector, the articulated arm on which the receiving antenna (112) was mounted was also eliminated in this embodiment, attaching it directly to the aerial module (1). In this embodiment, the positioning and guidance system (13)

of the aerial module (1) was responsible for maintaining the receiving antenna (112) oriented towards the mobile telephone base station antenna throughout the measurement path (7).

As the electromagnetic emission measurement unit (11) was based on a coherent detector, amplitude and phase data (or equivalently, those of the real and imaginary part) of the electromagnetic field (E) radiated were available. Therefore, in this embodiment it was not necessary to execute the iterative phase-recovery algorithm (40).

The amplitude and phase data measured from the radiated electromagnetic field (E), georeferenced with an accuracy equal to or less than 3 cm, were entered into the electromagnetic emission measurement processing unit (23) to perform the characterization and diagnosis of the mobile telephone base station antenna. In this embodiment the near-field—near-field transformation algorithm for the obtaining of the electromagnetic field distribution at the aperture of the antenna (41) obtained a tolerance or difference between the radiated electromagnetic field (E) and the theoretical electromagnetic field less than or equal to 1% after 15 iterations.

The results of the diagnosis and characterization of the antenna for the mobile telephone base station, i.e. the radiation source diagram (70), radiation pattern and electromagnetic protection volume, showed a difference of less than 2% with regard to the same results obtained in the embodiment in example 1.

Example 3

For this embodiment, the system described in example 1 was employed, but using two aerial modules (1). Two measurement paths (7) were defined: the first consisted of a zigzag path contained in a vertical plane measuring 6 m×6 m located 5 m in front of the aperture plane (62) of the mobile telephone base station antenna and centred with regard to the antenna. The second was identical to the first, but deployed 5 m behind the aperture plane (62), in order to also characterize the rearward radiation of the mobile telephone base station antenna. In this embodiment, by using a power detector in both aerial modules (1) it was necessary to apply the iterative phase-recovery algorithm (40).

It was observed that having more measurement points, the iterative phase-recovery algorithm (40) required 45 iterations to obtain a tolerance or difference equal to or less than 2% between the amplitude of the theoretical electromagnetic field calculated from a set of auxiliary coefficients and the amplitude of the electromagnetic field (E) radiated, i.e. 8 iterations less than in example 1.

In this embodiment, the results of the diagnosis and characterization of the mobile telephone base station antenna, i.e. the radiation source diagram (70), radiation pattern and electromagnetic protection volume, showed a difference of less than 3% with regard to the same results obtained in the embodiment in example 1. The differences in the results of the embodiments in examples 1, 2 and 3 were due in part to the tolerance presented by the power and coherent detectors used to measure the electromagnetic field (E) radiated, likewise to the tolerance or error in the positioning and georeferencing of the data, which was performed with an accuracy equal to or less than 3 cm.

The invention claimed is:

1. An airborne system for the measurement and characterization of at least one antenna or electromagnetic wave radiating system, comprising:

(a) at least one aerial module (1) which travels from point to point of a measurement path (7), the aerial module comprising (i) a receiving antenna (112) which captures an electromagnetic field (E) radiated by the at least one antenna or radiating system (5), (ii) an electromagnetic emission measurement unit (11) for receiving measurements of the electromagnetic field (E) radiated by the at least one antenna or radiating system, (iii) a positioning and guidance system (13) of the aerial module (1), and (iv) an aerial control device (15) which interfaces with the electromagnetic emission measuring unit (11), the positioning and guidance system (13), and a ground-based station (2);

(b) the ground-based station (2), which in turn comprises (i) a flight control system (21) for the aerial module (1), (ii) a processing unit (23) for processing the electromagnetic emission measurements (11) using a set of electromagnetic emission measurement processing algorithms (25) and a computer application (24); and (c) means for transmitting and receiving wireless signals between the aerial module (1) and the ground-based station (2);

wherein the receiving antenna (112) is directed towards the at least one antenna or radiating system (5);

wherein the electromagnetic emission measurement unit (11) comprises either (i) a coherent detector that measures the amplitude and/or phase of the electromagnetic field (E) radiated by the antenna or radiating system (5) measured at the measurement path (7) or (ii) a power detector that measures the amplitude of the electromagnetic field (E) radiated by the antenna or radiating system (5) measured at the measurement path (7);

wherein the positioning and guidance system (13) of the aerial module (1) comprises a global positioning system (131), a positioning system based on inertial sensors (132), a positioning system based on real-time satellite kinematic navigation (133) that exchanges information with a real-time satellite kinematic navigation base station (22) located at the ground-based station (2), and a positioning system based on photogrammetry (134), which sends information to the aerial control device (15) such that the positioning and guidance system provides a precise three-dimensional location of the aerial module (1) and georeferencing of the measurements of the electromagnetic field (E) radiated by the at least one antenna or radiating system (5) with an accuracy equal to or less than three centimeters;

wherein the electromagnetic emission measurement processing unit (23) characterizes the at least one antenna or radiating system (5) by processing the amplitude and/or phase of the electromagnetic field (E) radiated by the at least one antenna or radiating system (5);

wherein the set of electromagnetic emission measurement processing algorithms (25) comprises a near field-near field transformation algorithm (41) for obtaining a distribution of an electromagnetic field at an aperture of the at least one antenna, a near field-far field transformation algorithm (42) for obtaining an antenna radiation pattern and an algorithm for determining an electromagnetic protection volume (43) of the at least one antenna or radiating system (5);

wherein the computer application (24) provides the antenna radiation pattern, a radiation source diagram

(70) and/or the electromagnetic protection volume (61) of the at least one antenna or radiating system (5); and wherein the means for receiving and transmitting wireless signals between the aerial module (1) and the ground-based station (2) uses a frequency band selected from at least two different frequency bands in order to avoid overlap with a frequency of the electromagnetic field (E) radiated by the at least one antenna or radiating system (5).

2. The system according to claim 1, comprising two or more aerial modules (1), including the at least one aerial module.

3. The system according to claim 1, wherein the at least one aerial module (1) is an unmanned aerial vehicle.

4. The system according to claim 3, wherein the unmanned aerial vehicle is a multirotor.

5. The system according to claim 1, wherein the measurement path (7) has an arbitrary shape or geometry and a distance between one measurement point and another is equal to or less than three centimeters.

6. The system according to claim 1, wherein the receiving antenna (112) is coupled to a controlled articulated arm or to a controlled universal cardan joint suspension so that the receiving antenna can be directed towards the at least one antenna or radiating system (5).

7. The system according to claim 1, wherein the receiving antenna (112) is attached to the aerial module (1), which is oriented so as to direct it towards the at least one antenna or radiating system (5).

8. The system according to claim 1, wherein the electromagnetic emission measurement unit (11) comprises the coherent detector which measures the amplitude and phase of the electromagnetic field (E) radiated by the at least one antenna or radiating system (5), measured at the measurement path (7).

9. The system according to claim 1, wherein the electromagnetic emission measurement unit (11) comprises the power detector that measures the amplitude of the electromagnetic field (E) radiated by the antenna or radiating system (5), measured at the measurement path (7).

10. The system according to claim 9, wherein the electromagnetic emission measurement unit further comprises an iterative phase-recovery algorithm (40) which recovers the phase of the electromagnetic field (E) radiated by the at least one antenna or radiating system (5), based on the amplitude of the electromagnetic field (E) radiated by the at least one antenna or radiating system (5) measured at the measurement path (7).

11. The system according to claim 10, wherein the iterative phase-recovery algorithm (40) comprises a set of auxiliary coefficients characterizing the antenna or radiating system (5) by minimizing an FCa cost function defined by the following equation:

$$FCa=|||E|^2-|\tilde{E}(Iq(Ca))|^2||^2$$

where $|E|$ represents the amplitude of the electromagnetic field (E) radiated by the antenna or radiating system (5), measured at the measurement path (7), $|\tilde{E}|$ represents the amplitude of the theoretical electromagnetic field calculated from the set of auxiliary coefficients, Iq denotes the integral equations of the electromagnetic field that relate the theoretical electromagnetic field with the auxiliary coefficients, and Ca represents the auxiliary coefficients;

and wherein when the FCa cost function has a value less than a given tolerance, the amplitude of the theoretical electromagnetic field and the amplitude of the radiated electromagnetic field (E) are considered to be sufficiently similar so that the set of auxiliary coefficients enables the radiated electromagnetic field (E) to be modelled with an accuracy of less than or equal to the given tolerance.

12. The system according to claim 11, wherein the integral electromagnetic field equations are usable to calculate the theoretical electromagnetic field once the set of auxiliary coefficients has been calculated, wherein the electromagnetic field (E) radiated by the at least one antenna or radiating system (5) at the measurement path (7) is defined from the following expression:

$$E=|E|\exp(j<\tilde{E}>)$$

where $<\tilde{E}>$ is the phase of the theoretical electromagnetic field and $|E|$ is the amplitude of the electromagnetic field (E) radiated by the antenna or radiating system (5).

13. The system according to claim 1, wherein the flight control system (21) of the aerial module (1) comprises:
a manual flight control system (211); and
a path generation and automatic flight control system (212).

14. The system according to claim 1, wherein the means for transmitting and receiving wireless signals comprises a real-time bidirectional communication system (3) between the aerial module (1) and the ground-based station (2).

15. The system according to claim 14, wherein the communication system (3) comprises one or more 3G/4G communication modules and/or one or more low-frequency transceivers and/or an IEEE 802.11 interface (Wi-Fi) and/or one or more Zigbee™ brand modules and/or one or more Bluetooth™ brand modules, or a combination thereof.

16. An airborne system for the measurement and characterization of at least one antenna or electromagnetic wave radiating system, comprising:

(a) at least one aerial module (1) which travels from point to point of a measurement path (7), the aerial module comprising (i) a receiving, antenna (112) which captures an electromagnetic field (E) radiated by the at least one antenna or radiating system (5), (ii) an electromagnetic emission measurement unit (11) for receiving measurements of the electromagnetic field (E) radiated by the at least one antenna or radiating system, (iii) a positioning and guidance system (13) of the aerial module (1), and (iv) a network interface unit (15) which interfaces with the electromagnetic emission measuring unit (11), the positioning and guidance system (13), and a ground-based station (2);

(b) the ground-based station (2) comprises (i) a flight control system (21) for the aerial module (1), (ii) a processing unit (23) for processing the electromagnetic emission measurements (11) using a set of electromagnetic emission measurement processing algorithms (25) and a computer application (24); and (c) means for transmitting and receiving wireless signals between the aerial module (1) and the ground-based station (2);

wherein the receiving antenna (112) is directed towards the at least one antenna or radiating system (5);

wherein the electromagnetic emission measurement unit (11) directly or indirectly provides information on the amplitude and/or phase of the electromagnetic field (E) radiated by the antenna or radiating system (5) along the measurement path (7);

wherein the positioning and guidance system (13) of the aerial module (1) comprises a global positioning system (131), a positioning system based on inertial sensors (132), a positioning system based on real-time satellite kinematic navigation (133) that exchanges information with a real-time satellite kinematic navigation base station (22) located at the ground-based station (2), and a positioning system based on photogrammetry (134), which sends information to the aerial control device (15) such that the positioning and guidance system provides a precise three-dimensional location of the aerial module (1) and georeferencing of the measurements of the electromagnetic field (E) radiated by the at least one antenna or radiating system (5) with an accuracy equal to or less than three centimeters;

wherein the electromagnetic emission measurement processing unit (23) characterizes the at least one antenna or radiating system (5) by processing the amplitude and/or phase of the electromagnetic field (E) radiated by the at least one antenna or radiating system (5);

wherein the set of electromagnetic emission measurement processing algorithms (25) comprises a near field-near field transformation algorithm (41) for obtaining a distribution of an electromagnetic field at an aperture of the at least one antenna, a near field-far field transformation algorithm (42) for obtaining an antenna radiation pattern and an algorithm for determining an electromagnetic protection volume (43) of the at least one antenna or radiating system (5);

wherein the computer application (24) provides the antenna radiation pattern, a radiation source diagram (70) and/or the electromagnetic protection volume (61) of the at least one antenna or radiating system (5);

wherein the means for receiving and transmitting wireless signals between the aerial module (1) and the ground-based station (2) uses a frequency band selected from at least two different frequency bands in order to avoid overlap with a frequency of the electromagnetic field (E) radiated by the at least one antenna or radiating system (5);

wherein the near field-near field transformation algorithm (41) for obtaining distribution of the electromagnetic field at the aperture of the at least one antenna calculates a distribution of currents characterizing the antenna or radiating system (5) by minimizing an FCaf cost function given by the following equation:

$$FCaf = \|E - \tilde{E}(Iq(Meq))\|^2$$

where E represents the electromagnetic field (E) radiated by the antenna or radiating system (5) measured at the measurement path (7), $\tilde{E}$ represents the theoretical electromagnetic field calculated from the distribution of currents, Iq denotes the integral equations of the electromagnetic field that relate the theoretical electromagnetic field to the distribution of currents, and Meq represents the distribution of currents; and wherein when the FCaf cost function has a value less than a given tolerance, the theoretical electromagnetic field and the radiated electromagnetic field (E) are considered to be sufficiently similar so that the current distribution enables the radiated electromagnetic field (E) to be modelled with an accuracy of less than or equal to the given tolerance.

17. The system according to claim 16, wherein the theoretical electromagnetic field is calculable at any point in space using the integral equations of the electromagnetic field such that, once the current distribution has been calculated, a distribution of the theoretical electromagnetic field in a plane of aperture (71) of the at least one antenna or radiating system (5) is also calculated.

18. The system according to claim 17, wherein the radiation source diagram (70) provided by the computer application (24) corresponds to the distribution of the theoretical electromagnetic field in the plane of aperture (71) of the at least one antenna or radiating system (5).

19. The system according to claim 16, wherein the near field-far field transformation algorithm (42) for obtaining the radiation pattern of the antenna uses the current distribution characterizing the antenna or radiating system (5) to calculate the theoretical electromagnetic field at any point in space using the integral equations of the electromagnetic field, whereby to calculate the theoretical electromagnetic field in the far-field region of the antenna or radiating system (5) corresponding to the radiation pattern.

20. Ig system according to claim 16, wherein the algorithm for the determination of the volume of electromagnetic protection (43) of the at least one antenna or radiating system (5) uses the distribution of currents characterizing the at least one antenna or radiating system (5) to obtain the levels of the theoretical electromagnetic field in a cloud of points around the antenna or radiating system (5), subsequently to discriminate the points that are above the electromagnetic field reference level, thus obtaining a surface that delimits the volume of electromagnetic protection (61) of the at least one antenna or radiating system (5).

21. A method for the measurement and characterization of at least one antenna or radiating system (5) comprising the following stages:

(i) providing an airborne system comprising:
 (a) at least one aerial module (1) which travels from point to point of a measurement path (7), the aerial module comprising (i) a receiving antenna (112) which captures an electromagnetic field (E) radiated by the at least one antenna or radiating system (5), (ii) an electromagnetic emission measurement unit (11) for receiving measurements of the electromagnetic field (E) radiated by the at least one antenna or radiating system, (iii) a positioning and guidance system (13) of the aerial module (1), and (iv) a network interface unit (15) which interfaces with the electromagnetic emission measuring unit (11), the positioning and guidance system (13), and a ground-based station (2);
 (b) the ground-based station (2) comprises (i) a flight control system (21) for the aerial module (1), (ii) a processing unit (23) for processing the electromagnetic emission measurements (11) using a set of electromagnetic emission measurement processing algorithms (25) and a computer application (24); and
 (c) means for transmitting and receiving wireless signals between the aerial module (1) and the ground-based station (2):
  wherein the receiving antenna (112) is directed towards the at least one antenna or radiating system (5);
  wherein the electromagnetic emission measurement unit (11) directly or indirectly provides information on the amplitude and/or phase of the electromagnetic field (E) radiated by the antenna or radiating system (5) along the measurement path (7);

wherein the positioning and guidance system (13) of the aerial module (1) comprises a global positioning system (131), a positioning system based on inertial sensors (132), a positioning system based on real-time satellite kinematic navigation (133) that exchanges information with a real-time satellite kinematic navigation base station (22) located at the ground-based station (2), and a positioning system based on photogrammetry (134), which sends information to the aerial control device (15) such that the positioning and guidance system provides a precise three-dimensional location of the aerial module (1) and georeferencing of the measurements of the electromagnetic field (E) radiated by the at least one antenna or radiating system (5) with an accuracy equal to or less than three centimeters;

wherein the electromagnetic emission measurement processing unit (23) characterizes the at least one antenna or radiating system (5) by processing the amplitude and/or phase of the electromagnetic field (E) radiated by the at least one antenna or radiating system (5);

wherein the set of electromagnetic emission measurement processing algorithms (25) comprises a near field-near field transformation algorithm (41) for obtaining a distribution of an electromagnetic field at a plane of aperture of the at least one antenna, a near field-far field transformation algorithm (42) for obtaining an antenna radiation pattern and an algorithm for determining an electromagnetic protection volume (43) of the at least one antenna or radiating system (5), wherein the computer application (24) provides the antenna radiation pattern, a radiation source diagram (70) and/or the electromagnetic protection volume (61) of the at least one antenna or radiating system (5);

wherein the means for receiving and transmitting wireless signals between the aerial module (1) and the ground-based station (2) uses a frequency b and selected from at least two different frequency bands in order to avoid overlap with a frequency of the electromagnetic field (E) radiated by the at least one antenna or radiating system (5);

(ii) defining a measurement path (7) around the at least one antenna or radiating system (5) to be measured and characterized;

(iii) directing the receiving antenna (112) towards the at least one antenna or radiating system (5);

(iv) obtaining a measurement of the electromagnetic field (E) radiated by the at least one antenna or radiating system (5) by means of the electromagnetic emission measurement unit (11);

(v) sending the measurement of the electromagnetic field (E) radiated by the at least one antenna or radiating system (5) and a precise three-dimensional location of the aerial module (1) to the ground-based station (2) with the means for transmitting and receiving wireless signals (3); and (vi) processing the measurement of the electromagnetic field (E) radiated by the antenna or radiating system (5) in the electromagnetic emission measurement processing unit (23) to obtain the radiation pattern, the distribution of the electromagnetic field at the plane of aperture (71) and the electromagnetic protection volume (61) of the at least one antenna or radiating system (5), by means of the set of electromagnetic emission measurement processing algorithms (25).

22. The method according to claim 21, wherein the airborne system comprises at least two aerial modules, each of the aerial modules comprising (i) a receiving antenna (112) which captures the electromagnetic field (E) radiated by the at least one antenna or radiating system (5), (ii) an electromagnetic emission measurement unit (11) for receiving measurements of the electromagnetic field (E) radiated by the at least one antenna or radiating system, (iii) a positioning and guidance system (13), and (iv) a network interface unit (15) which interfaces with the electromagnetic emission measuring unit (11), the positioning and guidance system (13), and the ground-based station (2);

wherein stages (ii) to (v) are performed by the at least two aerial modules (1) which send respective measurements of the electromagnetic field (E) radiated by the at least one antenna or radiating system (5) and respective precise three-dimensional locations to the ground-based station (2).

23. The method according to claim 21, wherein in stage (iv) the electromagnetic emission measurement unit (11) also processes the measurement of the electromagnetic field (E) radiated by the at least one antenna or radiating system (5) to convert it into a digital sequence, and in stage (vi) the electromagnetic emission measurement processing unit (2) processes the measurement of the electromagnetic field (E) using the digital sequence.

24. The method according to claim 21, further comprising varying a position of the aerial module (1) along the measurement path (7) and repeating stages (iii), (iv) and (v) prior to step (vi).

* * * * *